(12) United States Patent
Teng et al.

(10) Patent No.: US 6,793,780 B2
(45) Date of Patent: Sep. 21, 2004

(54) STAMPER FORMING METHOD

(75) Inventors: Kuo-Hsin Teng, Taipei (TW); Hao-Chia Liao, Taipei (TW)

(73) Assignee: Prodisc Technology Inc., Taipei (TW)

( * ) Notice: Subject to any disclaimer, the term of this patent is extended or adjusted under 35 U.S.C. 154(b) by 7 days.

(21) Appl. No.: 10/290,304

(22) Filed: Nov. 8, 2002

(65) Prior Publication Data

US 2004/0055872 A1 Mar. 25, 2004

(30) Foreign Application Priority Data

Sep. 19, 2002 (TW) ........................................ 91121513 A

(51) Int. Cl.⁷ ............................ C23C 14/34; G03C 5/00
(52) U.S. Cl. ............................ 204/192.2; 204/192.12; 204/192.15; 430/320; 430/326
(58) Field of Search ................ 204/192.12, 192.15, 204/192.2; 430/320, 326

(56) References Cited

U.S. PATENT DOCUMENTS 4,837,130 A * 6/1989 Ohta et al. .................. 430/321
5,667,658 A * 9/1997 Koop et al. .................. 205/50

* cited by examiner

Primary Examiner—Steven Versteeg
(74) Attorney, Agent, or Firm—Birch, Stewart, Kolasch & Birch, LLP

(57) ABSTRACT

A stamper forming method, including the following steps: coating a first photoresist on a substrate, coating a stop layer on the first photoresist, coating a second photoresist on the stop layer, exposing the second photoresist by using a beam of light, exposing the first photoresist by using another beam of light, developing the first photoresist and the second photoresist, and sputtering a metal layer over the second photoresist. The invention also discloses another stamper forming method.

18 Claims, 7 Drawing Sheets

STAMPER FORMING METHOD

BACKGROUND OF THE INVENTION

1. Field of Invention

The invention relates to a stamper forming method and, in particular, to a stamper forming method for digital audio/video (AV) optical disks.

2. Related Art

During the optical disk production process, the original digital data or signals have to be converted into laser embossing signals. After completing the embossing and electroplating processes in a clean room, a master for mass production is then produced. Afterwards, the master is used to make a stamper for subsequent production processes.

As shown in FIG. 1A, a CD-R/RW or DVD-R stamper is formed with a plurality of grooves of the same depth, H1 (about 25 nm to 30 nm), in a readable embossed area (Area A) and an unreadable embossed area (Area B). To make optical disks compatible with CD-ROM drives and to allow a normal DVD-ROM to read optical disks with the DVD-RW format, signals in the readable embossed area (Area A) are partially modified in DVD-RW Ver 1.1. More explicitly, the groove depth H2 of the readable embossed area (Area A) is increased to 100 nm, as shown in FIG. 1B, for enhancing the signal reading mode.

However, in current manufacturing processes, laser beams of different strengths are used to directly etch desired groove depths (H1 and H2) on positive photoresist 3 in the stamper (FIG. 1B). As energy dispersion in photoresist is difficult to control, using a laser beam with a fixed intensity may still result in grooves with an error of depth between 2 nm and 3 nm. The precision of the groove depth is therefore difficult to control. Moreover, there may be problems of poor homogeneity and different geometries in the grooves with the depths (H1 and H2), as shown in FIG. 1C. The above-mentioned problems are not good for optical signal reading.

In view of the foregoing problems, the inventor provides a stamper forming method that has been implemented in the laboratory to solve the problems.

SUMMARY OF THE INVENTION

It is an objective of the invention to provide a stamper forming method with high precision, simple controls, improved homogeneity, and standard geometrical shapes for the grooves.

To achieve the above objective, the invention provides a stamper forming method including the following steps: coating a first photoresist on a substrate, coating a stop layer on the first photoresist, coating a second photoresist on the stop layer, exposing the second photoresist by using a beam of light, exposing the first photoresist by using another beam of light, developing the first photoresist and the second photoresist, and sputtering a metal layer. Moreover, the invention also provides another stamper forming method including the following steps: coating a first photoresist on a substrate, coating a first stop layer on the first photoresist, coating a second photoresist on the first stop layer, coating a second stop layer on the second photoresist, coating a third photoresist on the second stop layer, exposing the third photoresist by using a beam of light, exposing the second photoresist by using another beam of light, exposing the first photoresist by using yet another beam of light, developing the first, second, and third photoresists, and sputtering a metal layer in the direction of the third photoresist.

The stamper forming method of the invention improves the geometrical shape of the grooves to meet the desired standards by changing the number of photoresist and inserting stop layers between the photoresists. In comparison with the prior art, the depth of the grooves can be readily and precisely controlled in the disclosed multilayer photoresist structure. Adjusting the number of photoresist layers can form grooves of different depths. Since there are problems due to the difficulty in controlling energy dispersion in the photoresist, the homogeneity and geometry of the grooves therefore have a higher level of precision, which is good for optical signal reading. The yield of the stamper also increases at the same time. In view of the above-mentioned advantages, the disclosed stamper forming method is very useful in the industry.

BRIEF DESCRIPTION OF THE DRAWINGS

The invention will become more fully understood from the detailed description given in the herein below illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
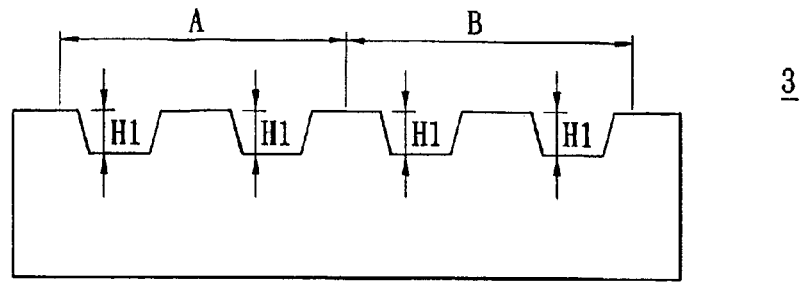
FIG. 1A is a schematic view of a CD-R/RW or DVD-R stamper.
Figure 1B:
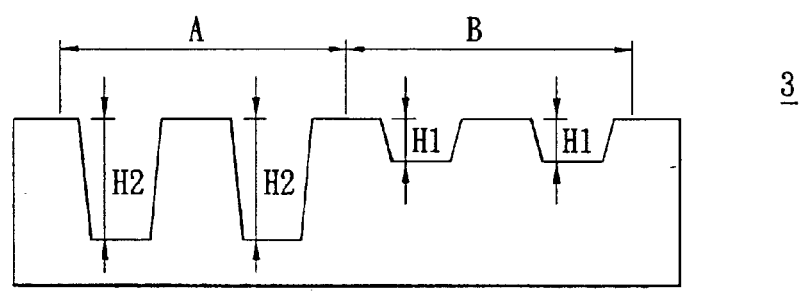
FIG. 1B is a schematic view of the stamper of a DVD-RW Ver 1.1.
Figure 1C:
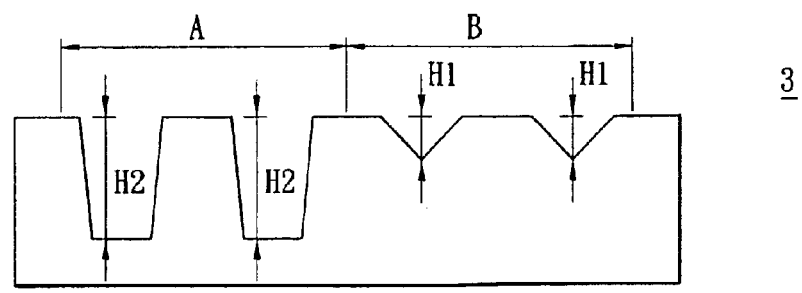
FIG. 1C is a schematic view of the stamper formed using a conventional stamper forming method.
Figure 2:
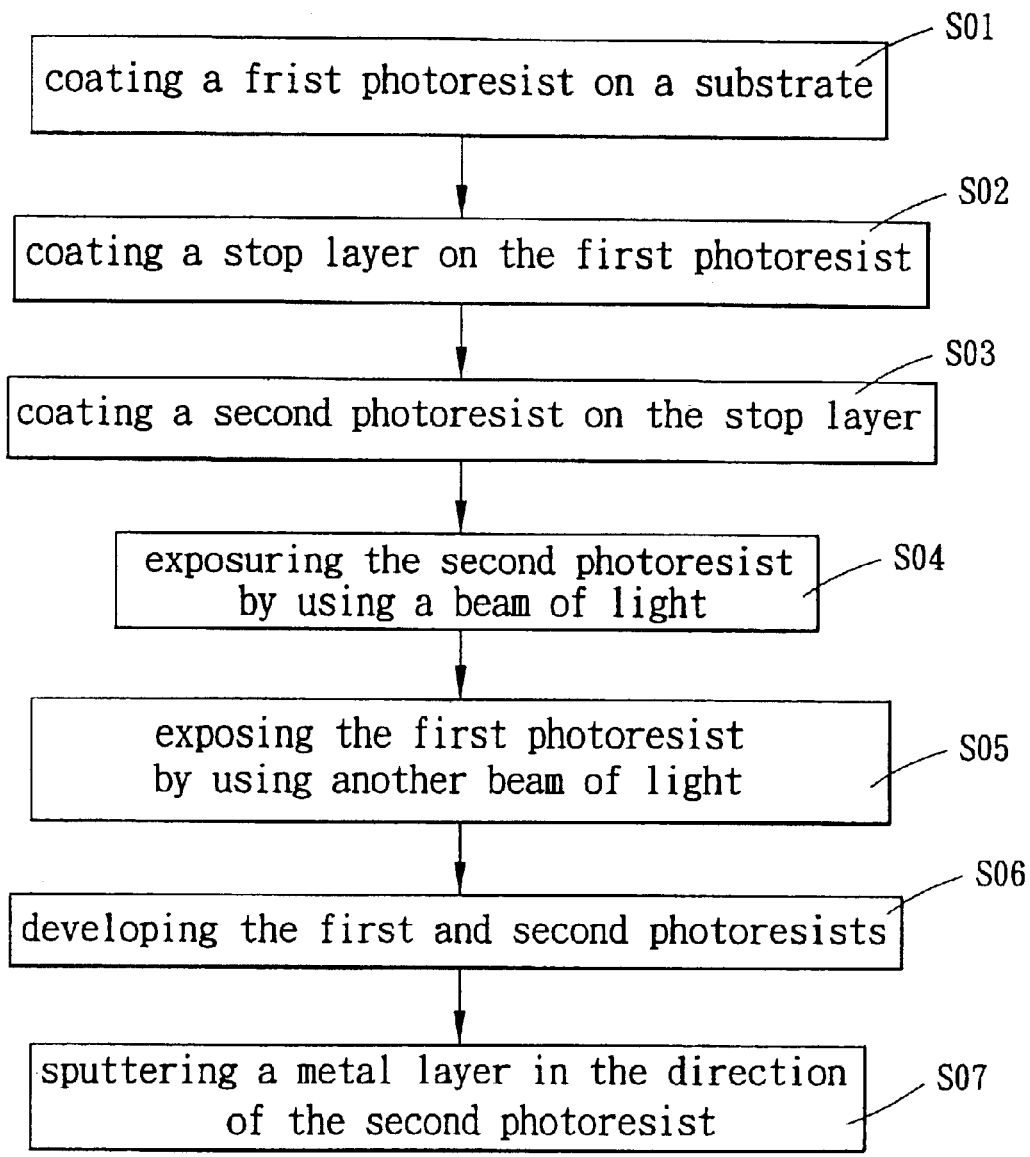
FIG. 2 is a block diagram of the stamper forming method according to the first embodiment.

As shown in FIG. 2, a first embodiment of the disclosed stamper forming method includes the following steps. First, a substrate is coated with a first photoresist (S01). The first photoresist is then coated with a stop layer (S02). The stop layer is further coated with a second photoresist (S03). The second photoresist is exposed using a beam of light (S04). The first photoresist is exposed using another beam of light (S05). Afterwards, the first and seconds photoresists are developed (S06). Finally, a metal layer is formed on the second photoresist by sputtering (S07).

In the current embodiment, the stamper 1 is an optical disk stamper. In particular, it is an optical disk stamper for making digital versatile discs (DVD's).

Figure 3A:
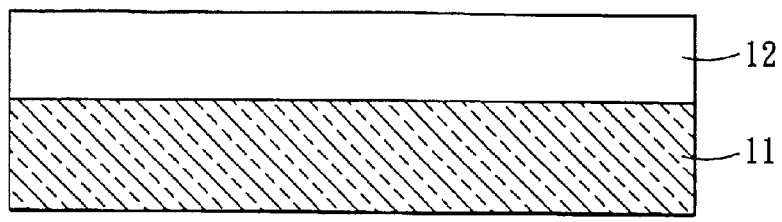
FIGS. 3A to 3E schematically illustrate the first embodiment.

As shown in FIG. 3A, the substrate 11 is coated with a first photoresist 12 in step S01. The substrate 11 is a glass substrate. Before coating the first photoresist 12, the surface of the substrate 11 is cleaned with a detergent. The surface is then coated with a primer, thereby enhancing the binding between the substrate 11 and the first photoresist 12.

Figure 3B:
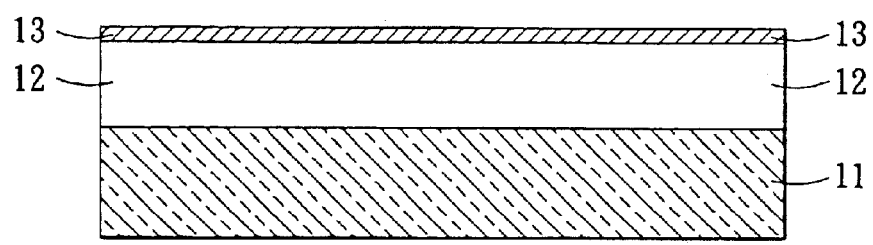

As shown in FIG. 3B, the first photoresist 12 is coated with a stop layer 13 in step S02. In the current embodiment, the thickness of the stop layer 13 is between 1 nm and 100 nm. The stop layer 13 can be made of an inorganic material, such as metal (e.g. Ni/V alloys) or ceramics.

Figure 3C:
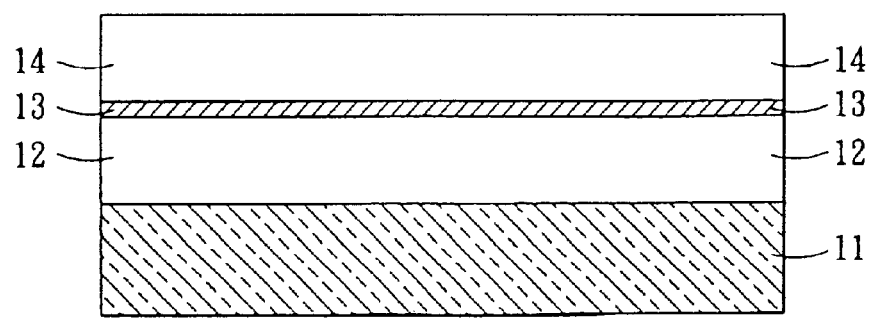

In step S03, the stop layer 13 is coated with a second photoresist 14, as shown in FIG. 3C.

In step S04, a beam of light is used to expose the second photoresist 14 for create the copy. In this step, the digital data on the original tape are converted into high-frequency signals by a mastering interface system (MIS) and output to a reader. Afterwards, a beam emitter (not shown) is driven to emit a beam of light on the substrate 11 coated with the second photoresist 14 to create a copy. In the current embodiment, the light beam can be an ultraviolet (UV) laser beam. The light spot formed from the UV laser beam can meet the standards used in recording a high-density DVD. Furthermore, one has to test the evenness of the disk before the exposure so as to ensure the product yield.

In step S05, another beam of light penetrates the stop layer 13 to expose the first photoresist 12. The intensity of this beam is stronger than that in step S04. The current beam does not only expose the second photoresist 14, but also exposes the first photoresist 12 through the stop layer 13. Similarly, step S05 also copies the digital data on the work tape.

It should be mentioned that the beams used in this embodiment are emitted from the same source. Of course, they can originate from different light sources.

Figure 3D:
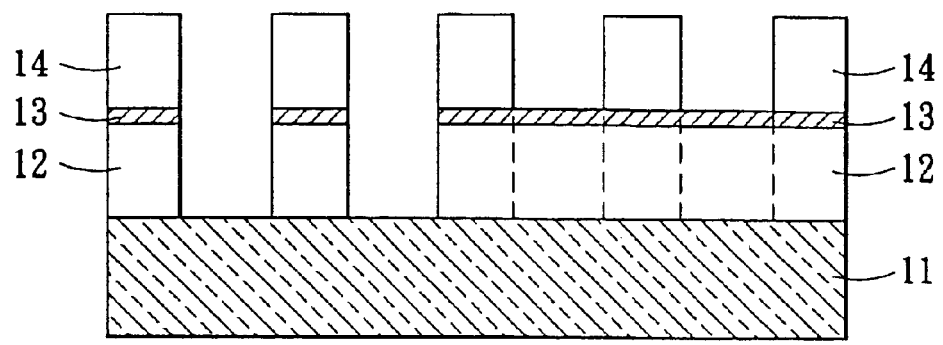

In step S06, a development solution washes away the exposed first photoresist 12, the exposed second photoresist 14, and the stop layer 13, as shown in FIG. 3D. In the current embodiment, the development solution is an alkaline solution (e.g. NaOH and KOH).

Figure 3E:
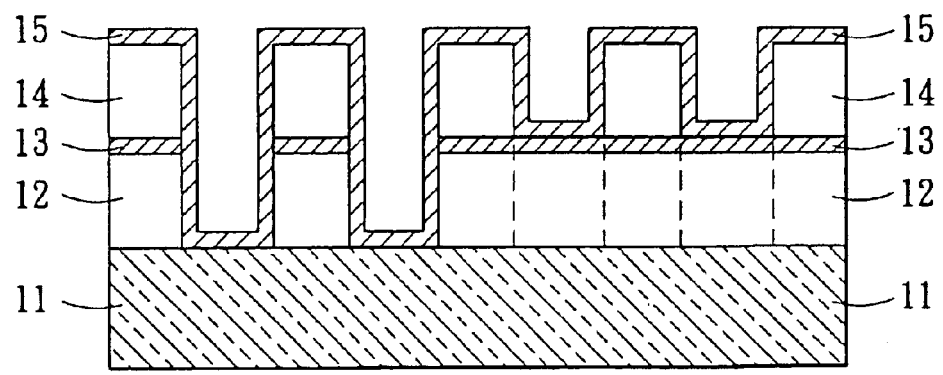

In step S07, a metal layer 15 is sputtered in the direction of the second photoresist 14 (see FIG. 3E). In this case, the sputtering is to form metal on the exposed and developed uneven parts. These uneven parts function as electrodes for the subsequent electroplating processes. In this embodiment, the metal layer 15 is made of an Ni/V alloy.

Figure 4:
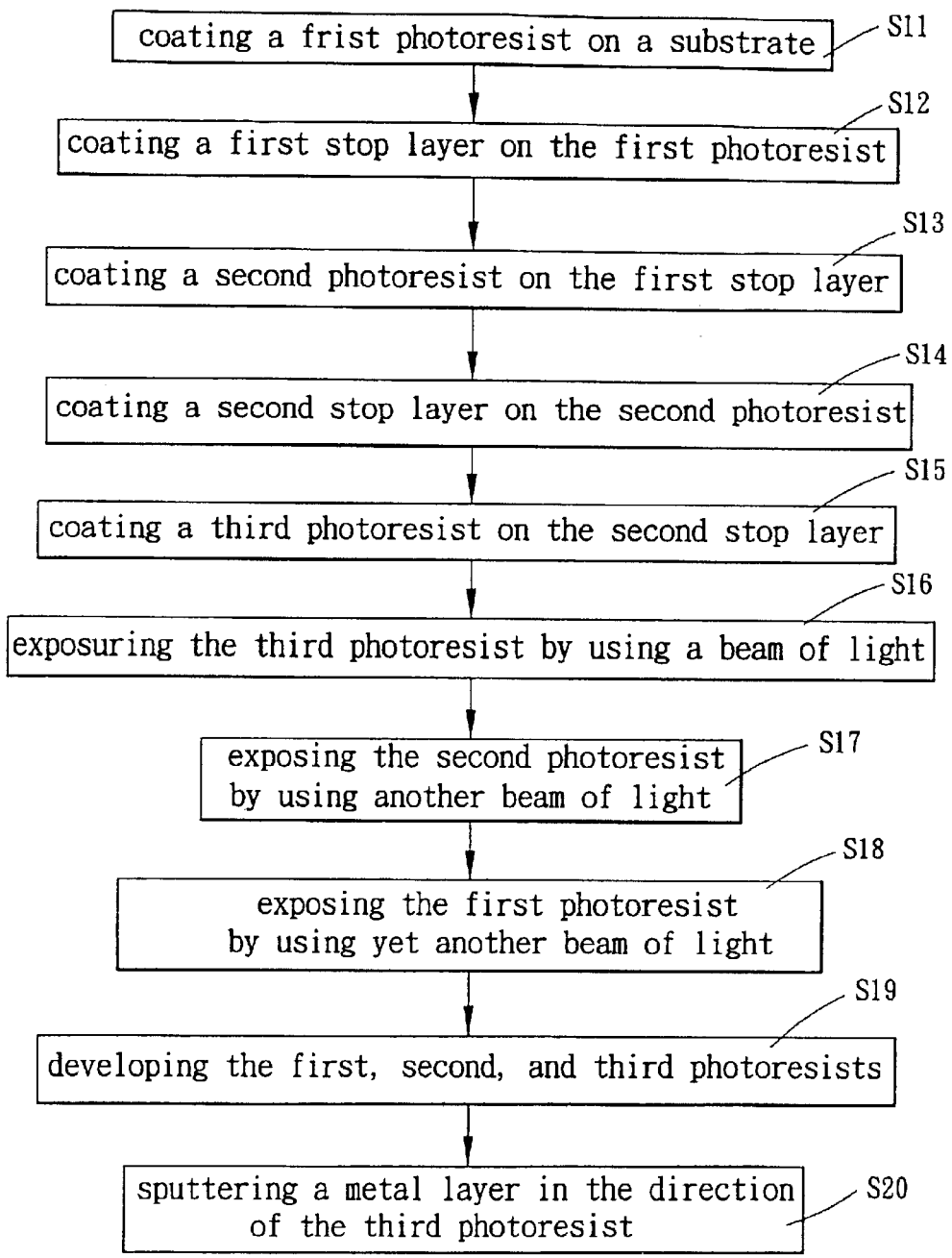
FIG. 4 is a block diagram of the stamper forming method according to the second embodiment.

As shown in FIG. 4, the second embodiment of the invention also provides a stamper forming method including the following steps: coating a first photoresist on a substrate (S11), coating a first stop layer on the first photoresist (S12), coating a second photoresist on the first stop layer (S13), coating a second stop layer on the second photoresist (S14), coating a third photoresist on the second stop layer (S15), exposing the third photoresist by using a beam of light (S16), exposing the second photoresist by using another beam of light (S17), exposing the first photoresist by using yet another beam of light (S18), developing the first, second, and third photoresists (S19), and sputtering a metal layer in the direction of the third photoresist (S20).

In this embodiment, the stamper 2 is also an optical disk stamper for making DVD's. For elements in the current embodiment that are the same as those in the first embodiment, those features and functions are exactly the same and we do not repeat the steps hereinafter.

Figure 5A:
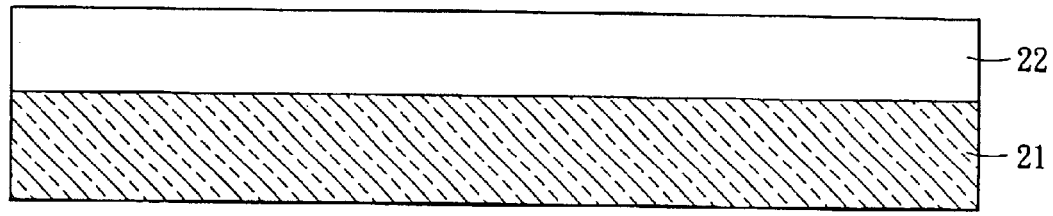
FIGS. 5A to 5D schematically illustrate the second embodiment.
Figure 5B:
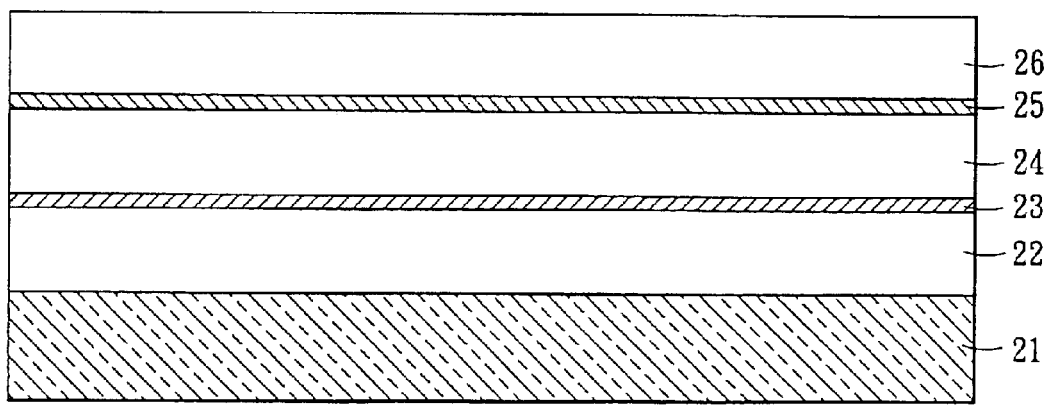

As demonstrated in FIG. 5A, a first photoresist 22 is coated on the substrate 21 in step S11. In steps S12, S13, S14, and S15, the first photoresist 22 is coated in order to create a first stop layer 23, a second photoresist 24, a second stop layer 25, and a third photoresist 26 (see FIG. 5B).

In step S16, a beam of light is used to expose the third photoresist 26. Another beam of light is then used to expose the second photoresist 24. Finally, a third beam of light is used to expose the first photoresist 22. In this embodiment, the intensities of the beams are adjusted according to practical needs.

Figure 5C:
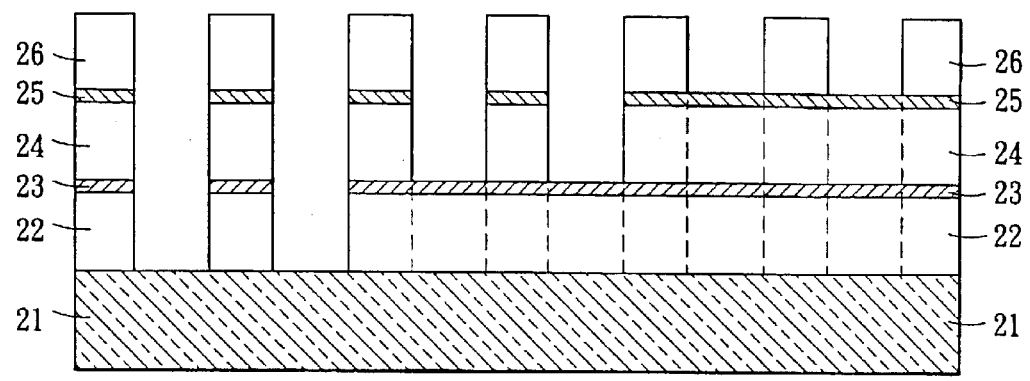

Exposure is performed in step S18, followed by step S19 in which the photoresists are developed (see FIG. 5C).

Figure 5D:
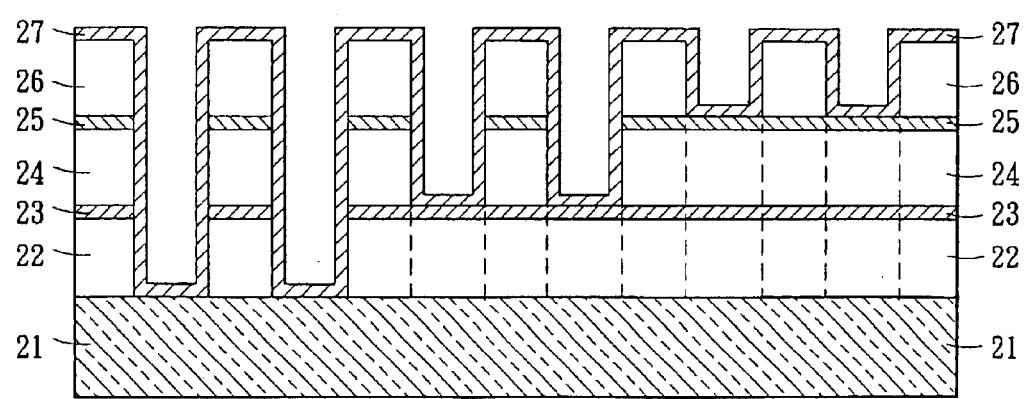

Finally, a metal layer 27 is sputtered in the direction of the third photoresist 26 in step S20 so that the stamper 2 is coated with a metal, as shown in FIG. 5D.

Of course, the number of photoresist and stop layers in between can be increased according to need. Using light beams of different intensities can form grooves with varied depths.

The stamper forming method of the invention utilizes a multiplayer photoresist structure and stop layers between the photoresists to increase the precision of the stamper shape, thereby achieving the desired specifications. In comparison with the prior art, the invention can more readily control the depth and geometrical shape of the grooves. By changing the number of photoresist layers, grooves of different depths can be produced. Since the problem caused by the difficulty in controlling energy dispersion when shining a laser beam on the photoresists is solved, the homogeneity and shape precision of the grooves are therefore enhanced for better optical signal reading. This also increases the yield of the stampers at the same time. From the above-mentioned advantages, one sees that the disclosed stamper forming method is valuable in industrial applications.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A stamper forming method for making a stamper, comprising the steps of:

coating a first photoresist on a substrate;

coating a stop layer on the first photoresist;

coating a second photoresist on the stop layer;

exposing the second photoresist by using a beam of light;

exposing the first photoresist by using another beam of light;

developing the first photoresist and the second photoresist; and sputtering a material toward the second photoresist to form a metal layer.

2. The stamper forming method of claim 1, wherein the substrate is a glass substrate.

3. The stamper forming method of claim 1, wherein the stop layer is made of an inorganic material.

4. The stamper forming method of claim 3, wherein the stop layer is metal.

5. The stamper forming method of claim 4, wherein the stop layer is made of an Ni/V alloy.

6. The stamper forming method of claim 3, wherein the stop layer is ceramics.

7. The stamper forming method of claim 1, wherein the thickness of the stop layer is between 1 nm and 100 nm.

8. The stamper forming method of claim 1, wherein the metal layer is an Ni/V alloy.

9. The stamper forming method of claim 1, wherein the stamper is an optical disk stamper.

10. A stamper forming method for making a stamper, comprising the steps of:

coating a first photoresist on a substrate;

coating a first stop layer on the first photoresist;

coating a second photoresist on the first stop layer;

coating a second stop layer on the second photoresist;

coating a third photoresist on the second stop layer;

exposing the third photoresist by using a beam of light;

exposing the second photoresist by using another beam of light;

exposing the first photoresist by using yet another beam of light;

developing the first photoresist, the second photoresist, and the third photoresist; and sputtering a material toward the third photoresist to form a metal layer.

11. The stamper forming method of claim 10, wherein the substrate is a glass substrate.

12. The stamper forming method of claim 10, wherein the stop layers are made of an inorganic material.

13. The stamper forming method of claim 12, wherein the stop layers are metal.

14. The stamper forming method of claim 13, wherein the stop layers are made of an Ni/V alloy.

15. The stamper forming method of claim 12, wherein the stop layers are ceramics.

16. The stamper forming method of claim 10, wherein the thickness of the stop layers are between 1 nm and 100 nm.

17. The stamper forming method of claim 10, wherein the metal layer is an Ni/V alloy.

18. The stamper forming method of claim 10, wherein the stamper is an optical disk stamper.

* * * * *